United States Patent [19]

Adlerstein

[11] Patent Number: 5,084,750
[45] Date of Patent: Jan. 28, 1992

[54] PUSH-PULL HETEROJUNCTION BIPOLAR TRANSISTOR

[75] Inventor: Michael G. Adlerstein, Wellesley, Mass.

[73] Assignee: Raytheon Company, Lexington, Mass.

[21] Appl. No.: 658,160

[22] Filed: Feb. 20, 1991

[51] Int. Cl.⁵ ............................................. H01L 29/72
[52] U.S. Cl. ...................................... 357/34; 357/16; 357/40; 357/55
[58] Field of Search ................... 357/16, 34, 40, 55

[56] References Cited

U.S. PATENT DOCUMENTS

| | | | |
|---|---|---|---|
| 4,807,008 | 2/1989 | Chang et al. | 357/34 |
| 4,868,613 | 9/1989 | Hirachi | 357/34 |
| 4,939,562 | 7/1990 | Adlerstein | 357/16 |

Primary Examiner—Edward J. Wojciechowicz
Attorney, Agent, or Firm—Denis G. Maloney; Richard M. Sharkansky

[57] ABSTRACT

A heterojunction bipolar, push-pull transistor includes a substrate, a first bipolar transistor region including a first collector layer, a first base layer and a first emitter layer disposed over said substrate and a second bipolar transistor region including a second collector layer, a second base layer and a second emitter layer disposed over said first bipolar transistor region. The transistor further includes a first base electrode coupled to said first and second base layers, a first emitter electrode coupled to said first and second emitter layers, and a first collector electrode coupled to said second collector layer.

16 Claims, 6 Drawing Sheets

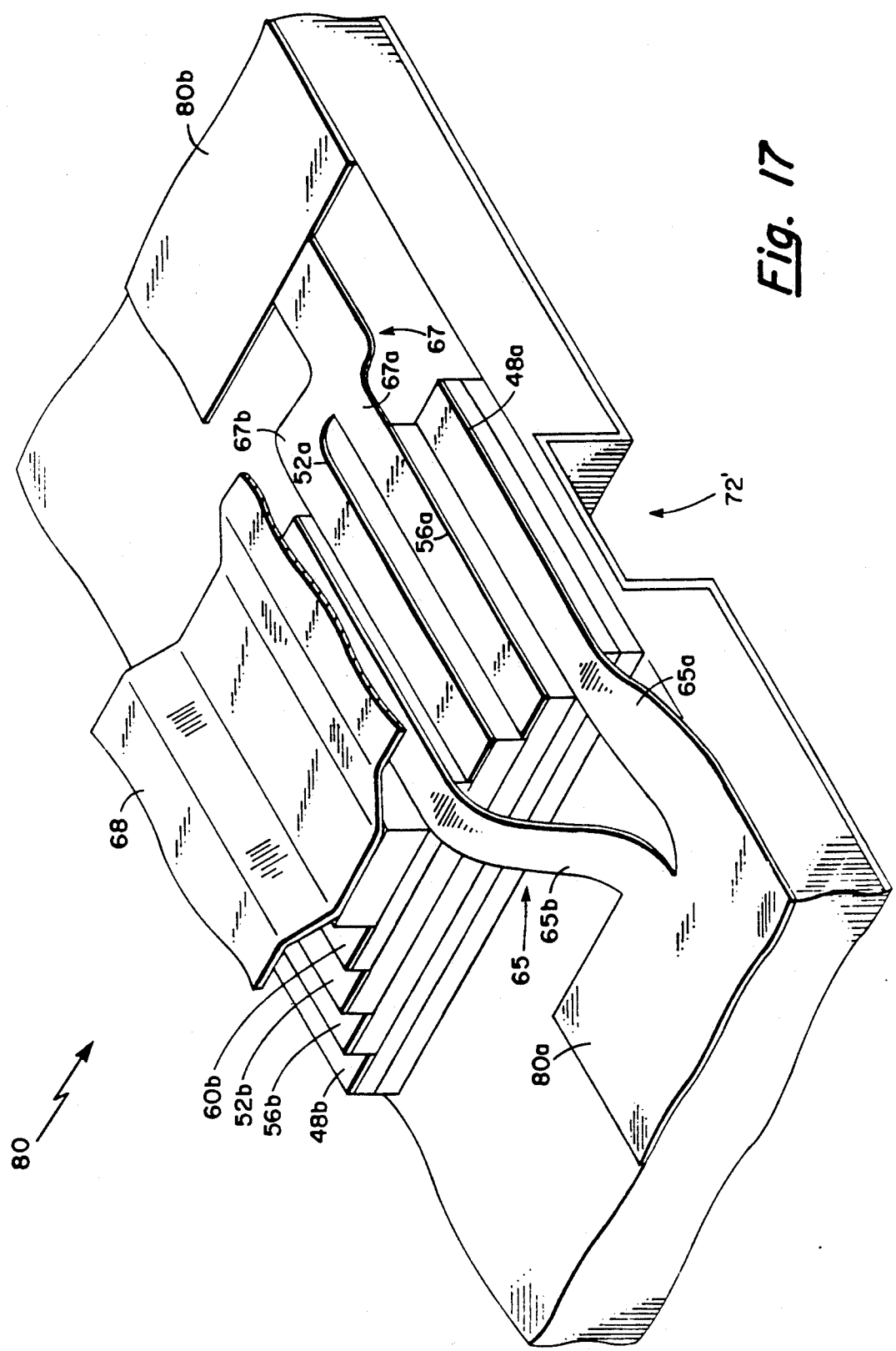

PUSH-PULL HETEROJUNCTION BIPOLAR TRANSISTOR

BACKGROUND OF THE INVENTION

This invention relates generally to semiconductor devices and more particularly to bipolar transistors.

As is known in the art, efficient generation of microwave power by solid state devices is required as an alternative to vacuum tube technology. Vacuum tubes such as travelling wave tubes, cross-field amplifiers and the like are costly and can be unreliable since high voltage power supplies and bias modulators are required. Solid state devices provide reliable, low voltage, low cost alternatives for many applications including, for example, phased array antennas and solid state transmitters.

One device used to generate microwave power is the heterojunction bipolar transistor (HBT). The HBT is similar to the conventional bipolar transistor in that the HBT includes collector, base and emitter layers disposed to form a pair of junctions. In general, a bipolar transistor is a three terminal device in which the upper layers (i.e. the base and emitter layers) are etched away in order to expose the underlying collector layer. Contacts are made to each of the layers to provide the three terminal device having collector, emitter, and base contacts. Generally, for an NPN type of device where the P material is the base layer, a hole current is injected into the base which produces in response an electron current across the emitter-base junction. If the hole current can be made relatively small in comparison to the emitter current which is produced across the emitter-based junction in response to the hole or base current, then the relatively small hole current can control a relatively large emitter current and the difference between the amount of hole current and the amount of emitter current produced will provide amplification.

In silicon device technology, p-type and n-type dopants, having relatively similar and relatively high hole and electron mobilities respectively, are available which has permitted the development of a practical bipolar transistor with the use of alternating conductivity-type doped silicon layers, (i.e. alternating n-type and p-type layers) P-type doped gallium arsenide layers, however, have significantly lower hole mobilities than the electron mobilities of N-type doped GaAs. The resulting high base resistance has prevented practical development of a bipolar NPN gallium arsenide transistor for microwave applications.

To overcome this problem, the heterojunction bipolar transistor (HBT) was conceived. The HBT differs from a conventional bipolar transistor in that the HBT incorporates an emitter material having a band gap larger than that of the material used in the base. This arrangement provides an abrupt energy discontinuity at the base-emitter junction This discontinuity acts as a barrier to hole current which permits the use of a substantially higher base doping than in a conventional bipolar transistor. This reduces the parasitic base resistance and the accompanying RC time constants. In turn, thinner base layers can be used for faster response times. HBT operation in X-band is relatively simple to obtain.

Maximum peak power of the HBT is determined by the area of the HBT device which can be effectively matched without gain reduction due to parasitic resistances in series with the intrinsic transistor. However, large area HBTs have the disadvantage of low input impedance in the common emitter or common base modes and low output impedance in the common collector mode.

As is generally known, a circuit approach to increasing power and efficiency is to utilize complimentary NPN and PNP transistor devices in the so-called "push-pull" configuration. In a so-called "Class B" push-pull configuration a bias voltage is supplied to the base contacts of complimentary HBTs such that with no RF signal, neither HBT conducts. Alternate half cycles of the RF input signal cause the transistors to conduct alternately, and the overall collector efficiency of the amplifier is theoretically 78.5%. If the transistors have similar DC terminal current voltage relationships, the required load impedance of the pair is the same as that for a single transistor. In a so-called push-pull common collector configuration the emitter voltage amplitude is limited to approximately the emitter-collector breakdown voltage for either transistor but the total current swing is twice that of a single transistor. Thus, the output power delivered to a load is double that of a single transistor.

HBTs in a push-pull circuit configuration have been fabricated as MMIC chips by growing two different transistor layers separated by a distance on a substrate. The HBTs are formed in the two separated layers and are connected with a transmission line. Several problems exist with this push-pull circuit structure. The first problem is the large size of the resulting circuit. Due to yield problems of monolithic microwave integrated circuits (MMICs), area on a wafer is very costly and thus it is desirable to maximize the number of circuits fabricated on a given wafer. A second problem is that the high frequency performance of the circuit is limited because of the required transmission line interconnect between the two transistors.

Thus it would be desirable to provide a push-pull HBT structure which takes advantage of the high peak power capability of the HBT, which is relatively efficient and which is compact in size and which is capable of high frequency operation.

SUMMARY OF THE INVENTION

In accordance with the present invention, a composite transistor includes a first bipolar transistor region comprised of a first collector layer, a first base layer and a first emitter layer. Disposed over the first bipolar transistor region is a second bipolar transistor region comprised of a second collector layer, a second base layer and a second emitter layer. A first conductor is disposed to interconnect the first and second base layers to provide the base electrode of the transistor. A second conductor is disposed to interconnect the first and second emitter layers to provide the emitter electrode of the transistor. A third conductor is disposed over the second collector layer to provide the collector electrode of the transistor. With this particular arrangement, by using a first bipolar transistor region having disposed thereover a second bipolar transistor region and a plurality of conductors disposed to provide collector, base and emitter electrodes the recited structure maximizes the quantity of monolithic microwave integrated circuits which can be fabricated in a given wafer, thereby increasing yield and decreasing cost.

In accordance with a further aspect of the present invention, a Push-Pull Heterojunction Bipolar Transistor (HBT), having a plurality of base, collector and emitter electrodes includes a substrate having first and second opposing surfaces with a ground plane conductor disposed over a first surface thereof and having on a second surface thereof at least one doped region having a first type dopant which provides at least one sub-collector region on the second surface. Disposed over the sub-collector region on the second surface is a first layer comprised of a first Group III-V material being doped with the same type dopant as the sub-collector region. Disposed over at least portion of the first layer is a second layer, comprised of a Group III-V material being doped with a second dopant of opposite type to that used in the subcollector region. Disposed over the second layer, to provide a heterojunction with the second layer, is a third layer of a second different Group III-V material having a band gap characteristic which is higher than that of the first Group III-V material and being doped with the first type dopant. A fourth layer comprised of the second Group III-V material and being doped with the second type dopant is disposed over the third layer. Disposed over the fourth layer, to provide a heterojunction with the fourth layer, is a fifth layer of the first Group III-V material being doped with the first type dopant. A sixth layer of the first Group III-V material doped with the second type dopant is disposed over the fifth layer. Contacts are provided over the sixth layer to form a first ohmic collector contact to the sixth layer. Contacts are provided over the second and fifth layers to form a first and second plurality of ohmic base contacts to the second and fifth layers. Contacts are provided over the third and fourth layers to provide a first and second plurality of emitter contacts to the third and fourth layers. A via-hole is provided to the first surface of the substrate to interconnect the ground plane conductor on the first surface of the substrate with the subcollector region to provide a grounded collector contact for the first layer. With this particular arrangement, an improved push-pull common collector HBT is provided. The push-pull arrangement provided by the recited mesa structure provides a compact transistor cell. Since the two transistors are not coupled through a transmission line section, the transistor cell is not frequency limited due to the inductance of the interconnecting transmission line. Thus, the transistor cell is capable of performing at high frequencies.

BRIEF DESCRIPTION OF THE DRAWINGS

The foregoing features of this invention, as well as the invention itself, may be more fully understood from the following detailed description of the drawings in which:

FIG. 17 is an isometric view of the transistor circuit shown in FIG. 16.

DESCRIPTION OF THE PREFERRED EMBODIMENTS

Figure 1:
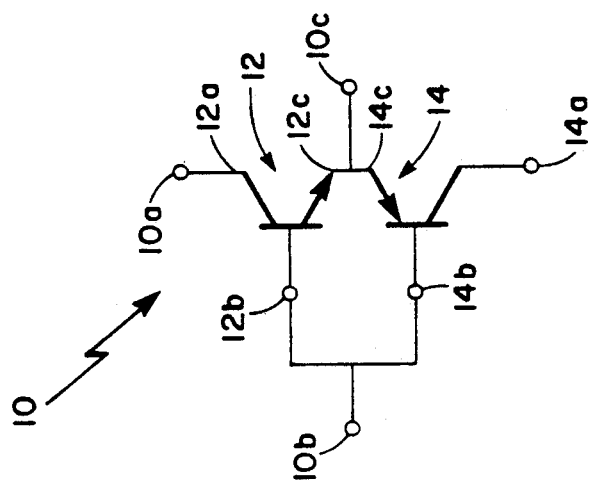
FIG. 1 is a schematic diagram of a single cell push-pull transistor circuit.

Referring now to FIG. 1, a push-pull transistor circuit 10 having terminals 10$a$, 10$b$ and 10$c$ is shown to include a first transistor 12 having collector electrode 12$a$ coupled to a terminal 10$a$ of transistor circuit 10, base electrode 12$b$, coupled to a terminal 10$b$ and emitter electrode 12$c$ coupled to a terminal 10$c$. Transistor circuit 10 further includes a second transistor 14, being doped with complimentary doping of transistor 12, having an emitter electrode 14$c$ coupled to emitter electrode 12$c$ and terminal 10$c$, a base electrode 14$b$ coupled to base electrode 12$b$ and terminal 10$c$ and collector electrode 14$a$.

Transistors connected in this way are said to form a so-called push-pull transistor cell which can be coupled in common collector, common emitter and common base configurations as desired. For example, a common collector configuration is provided by coupling electrode 14$a$ to ground and applying a DC bias to terminal 10$a$. In such a configuration, terminals 10$b$ and 10$c$ provide RF input and output terminals respectively.

Figure 2:
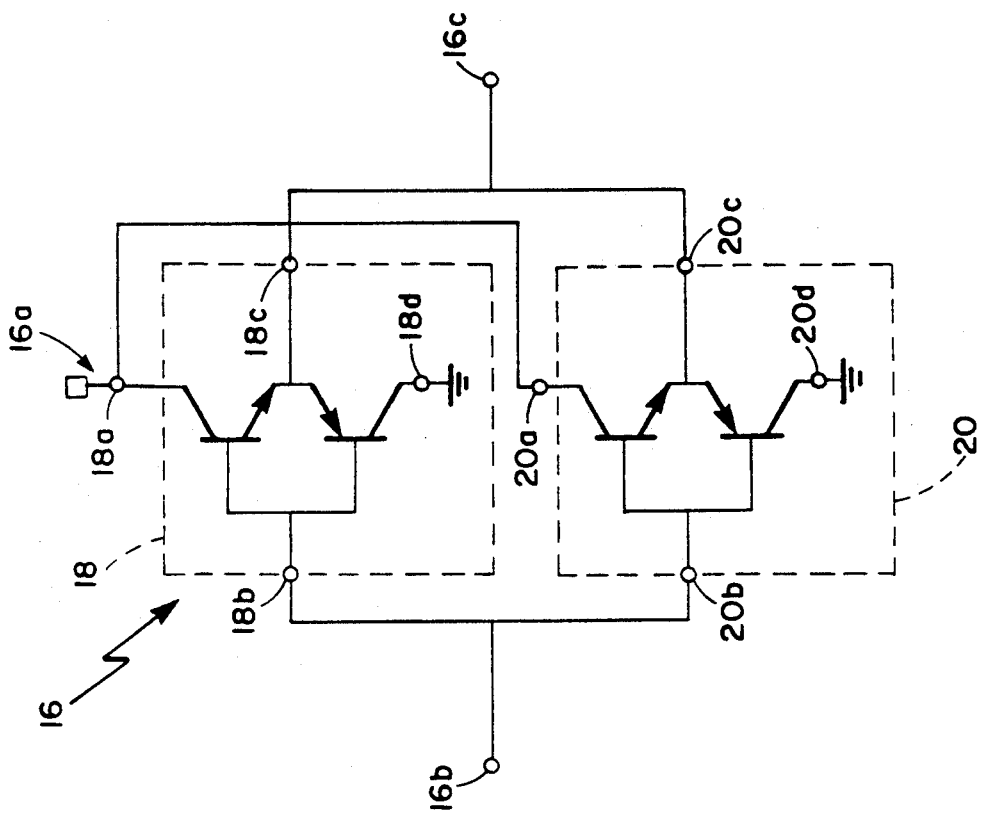
FIG. 2 is a schematic diagram of a multi-cell common collector push-pull transistor circuit.

Referring now to FIG. 2, a multi-cell push-pull common collector transistor 16 includes two common collector push-pull transistor cells, 18, 20. Transistor cells 18, 20 are each substantially the same as transistor cell 10, (FIG. 1). Transistor 16 further includes a DC bias terminal 16$a$ coupled to composite collector electrodes 18$a$, 20$a$; RF input terminal 16$b$ coupled to composite base electrodes 18$b$, 20$b$; RF output terminal 16$c$ coupled to composite emitter electrodes 18$c$, 20$c$; and second collector electrodes 18$d$, 20$d$ each coupled to ground.

Steps in the fabrication process of single or multi-cell push-pull transistors now will be described in conjunction with FIGS. 3-17. It should be noted that FIGS. 3-17 are illustrative only, intended to aid in the understanding of the invention.

Figure 3:
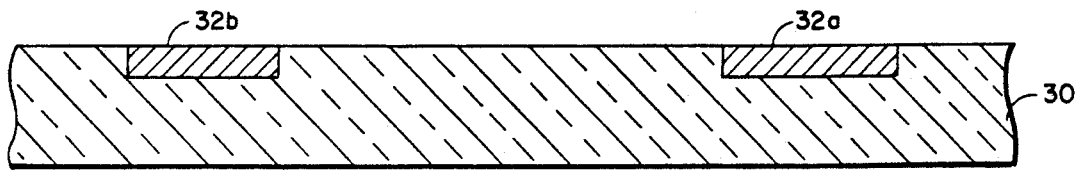
FIGS. 3-15 are a series of cross-sectional views showing steps in the fabrication of a single cell push-pull hetero-junction bipolar transistor circuit in accordance with an aspect of the present invention.

Referring now to FIG. 3 a substrate 30, comprised of gallium arsenide is shown to have a plurality of highly doped p-type subcollector regions 32$a$, 32$b$, the subcollector regions are doped by the introduction of a p-type dopant, such as beryllium (Be), Carbon (C) or Zinc (Zn) into substrate 30 via ion implantation techniques as is generally known. Alternative techniques such as epitaxial growth and selective ion implantation isolation techniques may also be used to provide sub-collector regions 32$a$, 32$b$.

Figure 4:
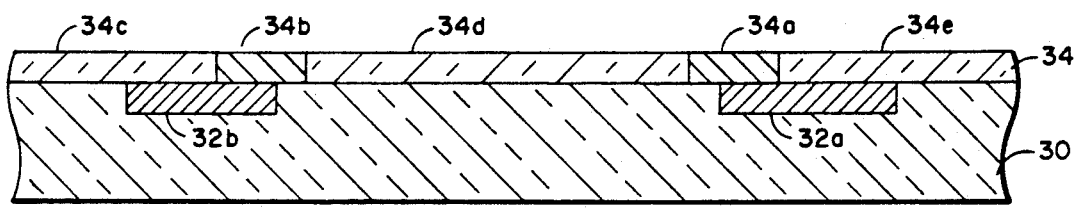

Referring now to FIG. 4, a p-type layer 34 having a typical thickness of 1.5 microns ($\mu$m) is disposed over substrate 30 using molecular beam epitaxy, (MBE), molecular chemical vapor deposition (MOCVD) or other techniques suitable for growth of relatively thin semiconductor layers. Collector regions 34$a$, 34$b$ are provided by implanting a species such as Oxygen (O) or Boron (B) into regions 34$c$, 34$d$ and 34$e$ to render such regions semi-insulating.

Figure 5:
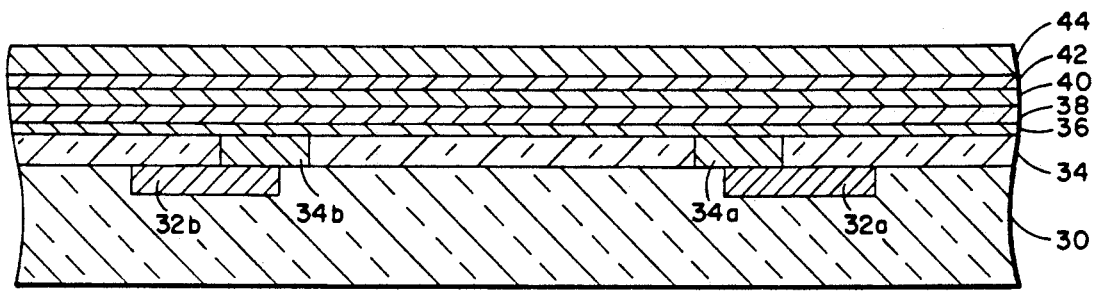

Referring now to FIG. 5 layer 34 is shown having a plurality of sequentially deposited layers disposed thereover. Said plurality of layers are comprised of suitably Group III-V semiconductor material alternately doped n and p type and disposed via the MBE, MOCVD or other techniques mentioned above.

Disposed over layer 34, thus, is a layer 36 here comprised of gallium arsenide (GaAs) which is suitably doped n-type by introduction of silicon (Si) or other Group IV material as dopant. Typically such a layer is doped to a dopant concentration in the range of $1 \times 10^{20}$ atoms/cc to $1 \times 10^{20}$ atoms/cc. Typically, layer 36 has a thickness in the range of 500Å to 1200Å. Disposed over layer 36 is a layer 38 here comprised of a wideband gap material such as aluminum gallium arsenide (AlGaAs) having a selected compositional ratio of aluminum to gallium in the range of 10% to 40% with 30% being preferred and which is suitably doped p-type by the introduction of preferably Be, Zn or C as a dopant having a dopant concentration in the range of $1 \times 10^{16}$ atoms/cc to $1 \times 10^{19}$ atoms/cc and having a thickness of typically 0.1μm to 0.3 μm. Disposed over layer 38 is a layer 40 here comprised of a wideband gap material, such as AlGaAs, with the same compositional ratio as that described above, but here doped n-type by the introduction of Si or other suitable Group IV material as a dopant to a concentration in the range of $1 \times 10^{19}$ atoms/cc to $1 \times 10^{20}$ atoms/cc and having a thickness of typically in the range of 0.1μm to 0.3μm.

Disposed over layer 40 is a layer 42 here comprised of an intermediate band gap material such as GaAs and which is suitably doped p-type by the introduction of Be, Zn or C as a dopant having a dopant concentration in the range of $1 \times 10^{19}$ atoms/cc to $1 \times 10^{20}$ atoms/cc and layer 42 having a thickness in the range of 500Å to 1200Å. Disposed over layer 42 is a layer 44 here comprised of an intermediate band gap material such as GaAs and which is suitably doped n-type by the introduction of Si or other Group IV material as a dopant having a dopant concentration in the range of $1 \times 10^{16}$ atoms/cc to $1 \times 10^{17}$ atoms/cc and having a thickness of typically 1.0 μm to 1.5 μm.

Figure 6:
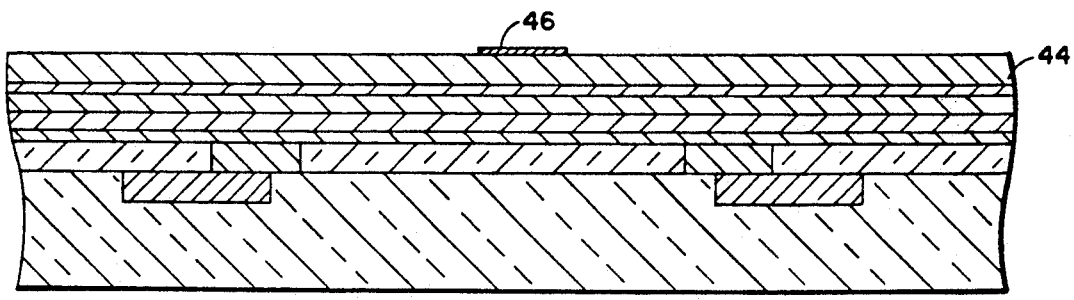
Figure 15:
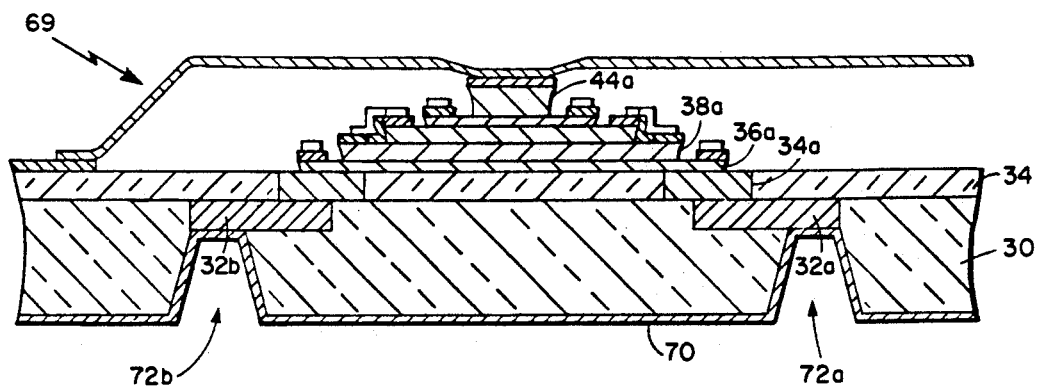

Referring now to FIG. 6, an electrode contact 46 is disposed over layer 44. Electrode 46 is provided by depositing a conductive layer (not numbered) such as a composite layer of a palladium-germanium alloy and a layer of gold (Pd-Ge-Au), and patterning such a conductive layer using well known techniques such as selectively etching the conductive layer to form electrode 46. Alternatively, electrode 46 is provided by depositing the composite conductor through a photo-resist layer (not shown) which is patterned to expose selected underlying portions of layer 44 and lifting off the photo-resist as is known to leave behind electrode 46. Electrode 46 is alloyed with layer 44 to provide a low resistively ohmic type contact to layer 44 and is used to provide here a first collector contact for HBT 69 (FIG. 15).

Figure 7:
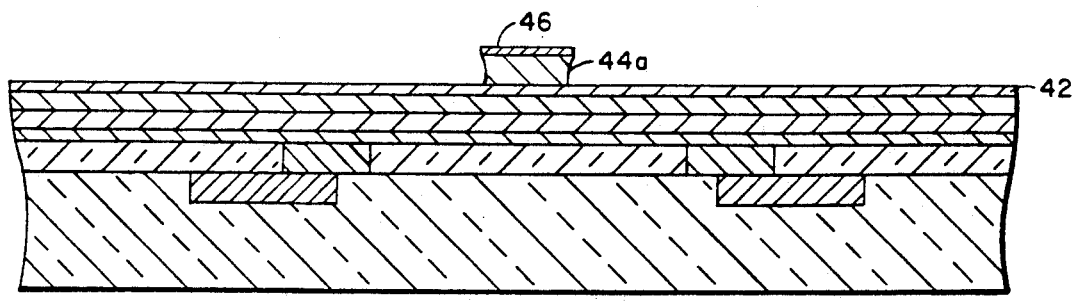

Referring now to FIG. 7, the layer 44 (FIG. 6) is etched to provide a collector semiconductor region 44a. Electrode 46 serves as a self aligned mask while etching layer 44 (FIG. 6) into collector semiconductor region 44a. Here the wafer is etched using a so-called selective etch technique in which the wafer is reactively ion etched using a mixture of BCl$_3$ and He vapors, which attack layer 44 (FIG. 6) in regions not covered by contact 46. This selective etch technique would require that a thin etch stop layer (not shown) of, for example, Indium Gallium Arsenide (InGaAs) having a thickness of typically 50 to 200 Angstroms, be disposed between layer 44 (FIG. 6) and layer 42.

Alternatively, the wafer could be time etched using a wet chemical etch such as a mixture of H$_2$SO$_4$:H$_2$O$_2$:H$_2$O in 1:8:160 proportions such that layer 44 (FIG. 6) is etched but layer 42 is not affected. Here, prior to etching, a layer of photo-resist (not shown) would be deposited over layer 44 (FIG. 6) to mask region 44a. Regions not covered by the photo-resist would be etched away. Thus a photoresist layer (not shown) acts as a mask during the etching of layer 44 (FIG. 6) to provide region 44a.

Figure 8:
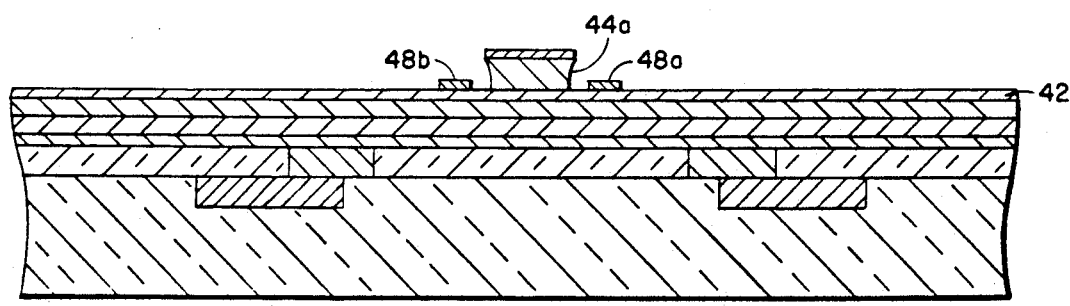

Referring now to FIG. 8, electrode contacts 48a, 48b are disposed over layer 42. Electrodes 48a, 48b are provided by depositing a composite conductive layer and patterning such a layer using well-known techniques as described in conjunction with FIG. 6. The selective etch technique described in conjunction with FIG. 7 provides an undercut to semiconductor region 44a. The undercut provides a distance typically of about 1000Å between electrodes 48a, 48b and semiconductor region 44a. Thus, electrodes 48a, 48b are prevented from contacting region 44a.

An optional dielectric coating (not shown) of, for example, silicon nitride having a thickness typically of about 1000Å may be provided to semi-conductor region 44a. Such a dielectric coating further aids in preventing electrodes 48a, 48b from contacting semiconductor region 44a. Electrodes 48a, 48b are alloyed with layer 42 to provide low resistivity ohmic type contacts to layer 42 and are used to provide here a first plurality of base electrodes for HBT 69 (FIG. 15).

Figure 9:
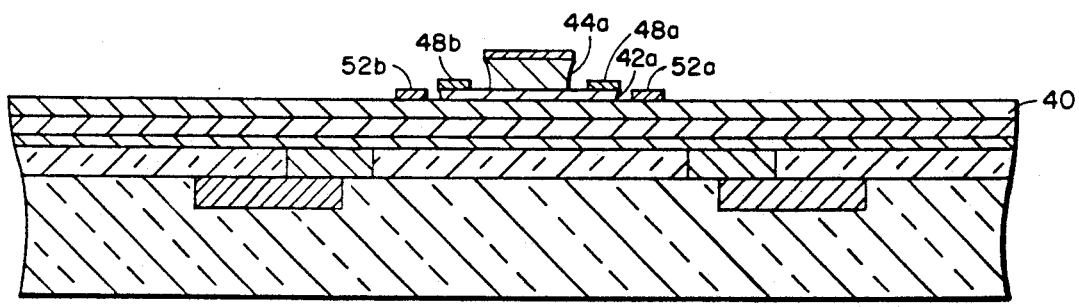

Referring now to FIG. 9, layer 42 (FIG. 8) is etched using the selective etch technique described in conjunction with FIG. 7 to provide a base semiconductor region 42a. Electrodes 48a, 48b are used as self-aligned masks during the selective etching process to provide semi-conductor region 42a. Since layer 40 is comprised of AlGaAs, an etch stop layer (not shown) normally required as described in conjunction with FIG. 7 would here be optional.

Alternatively, the time etched technique as described in conjunction with FIG. 7 could be used to provide region 42a. To use the time etch technique, a layer of photoresist (not shown) would first be deposited over collector semiconductor region 44a and base electrodes 48a, 48b to serve as a mask while time etching layer 42 (FIG. 8) to provide region 42a.

After base semiconductor region 42a is provided, layer 40 is provided with electrodes 52a, 52b which may be provided using the same patterning or lift off techniques described in conjunction with FIG. 6. The undercut provided by the selective etch technique prevents electrodes 52a, 52b from contacting semiconductor region 42a. Electrodes 52a, 52b are alloyed with layer 40 to provide low resistivity ohmic type contacts to layer 40 and are used to provide here a first plurality of emitter electrodes for HBT 69 (FIG. 15).

Alternatively, if the time etch technique were used the required masking photo-resist layer (not shown) would provide a distance between electrodes 52a, 52b and semiconductor region 42a and thus prevent electrodes 52a, 52b from contacting semiconductor region 42a.

Figure 10:
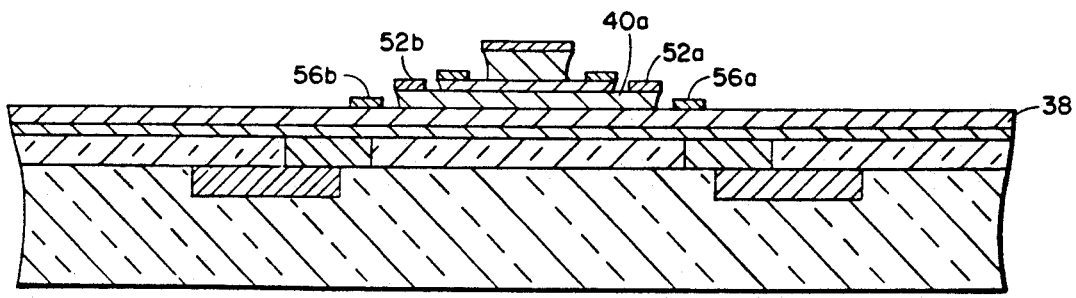

Referring now to FIG. 10, electrodes 52a, 52b are used as self-aligned masks during the selective etching of layer 40 (FIG. 9) to provide emitter semiconductor region 40a. Here, an etch stop layer (not shown) would be required between layers 40 (FIG. 9) and 38 since these layers are comprised of semiconductor materials which are similarly affected by the reactive ion etch.

Etching layer 40 (FIG. 9) into emitter semiconductor region 40a may alternatively be accomplished using the time etch technique previously described in conjunction with FIG. 7. In this case, a photo-resist layer (not shown) would be required to act as a mask to provide region 40a.

Electrodes 56a, 56b may be provided using the same patterning or lift off techniques described in conjunction with FIG. 6 and are alloyed with layer 38 to provide low resistivity ohmic type contacts to layer 38. Here electrodes 56a, 56b are used to provide a second plurality of emitter electrodes for HBT 69 (FIG. 15).

Figure 11:
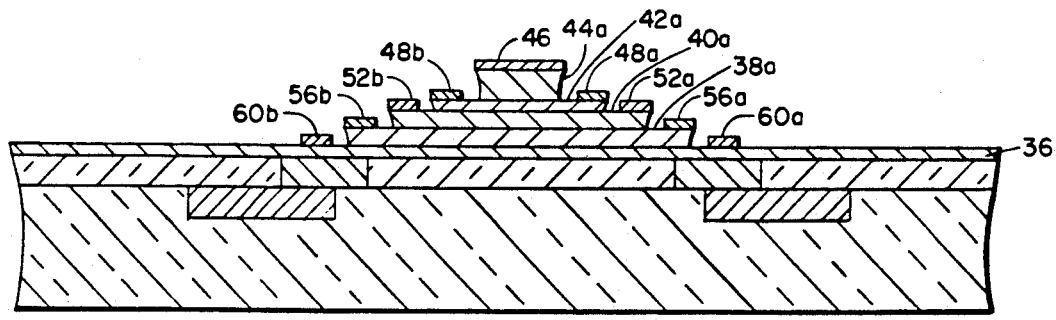

Referring now to FIG. 11, electrodes 56a, 56b are used as self-aligned masks during the selective etching of layer 38 (FIG. 10) to provide a second emitter semiconductor region 38a. Here an etch stop layer (not shown) would be disposed between layers 36 and 38 (FIG. 10) for reasons mentioned in conjunction with FIG. 7.

After second emitter region 38a is provided, layer 36 is provided with electrodes 60a, 60b using the patterning or lift off techniques described in conjunction with FIG. 6. Electrodes 60a, 60b are alloyed with layer 36 to provide low resistivity ohmic type contacts to layer 36 and provide a second plurality of base electrodes for HBT 69 (FIG. 15).

Etching layer 38 (FIG. 10) into region 38a may alternatively be accomplished using the time etch technique previously described in conjunction with FIG. 7. In this case, a photo-resist layer (not shown) is deposited over first collector region 44a, first base region 42a, first emitter region 40a and electrodes 56a, 56b to serve as a mask for etching second emitter region 38a.

Figure 12:
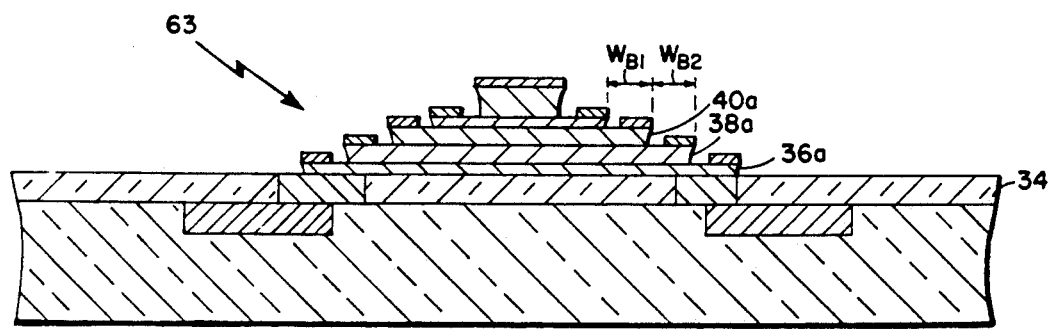

Referring now to FIG. 12, layer 36 (FIG. 11) is etched to provide a second base semiconductor region 36a via either the selective or time etch techniques as described in conjunction with FIG. 7. Here, to use the selective etch technique, an etch stop layer between layers 36 (FIG. 11) and 34 would be required for reasons previously mentioned in conjunction with FIG. 7.

First and second base semi-conductor regions 40a, 38a are provided having base contact widths $W_{B1}$, $W_{B2}$. Base contact width $W_{B1}$, $W_{B2}$ are selected to be approximately one to two times the base contact transfer length. The base contact transfer length corresponds to the length beyond which the base resistance may no longer be decreased by an increase in the width of the base contact. Thus, etching techniques able to provide such appropriate base widths are preferred techniques.

Electrodes of transistor cell 63 may be connected to provide, for example, so-called common emitter, common base or common collector push-pull transistor configurations.

The steps in providing transistor cell 63 as a common collector push-pull transistor cell will now be described in conjunction with FIGS. 13-15.

Figure 13:
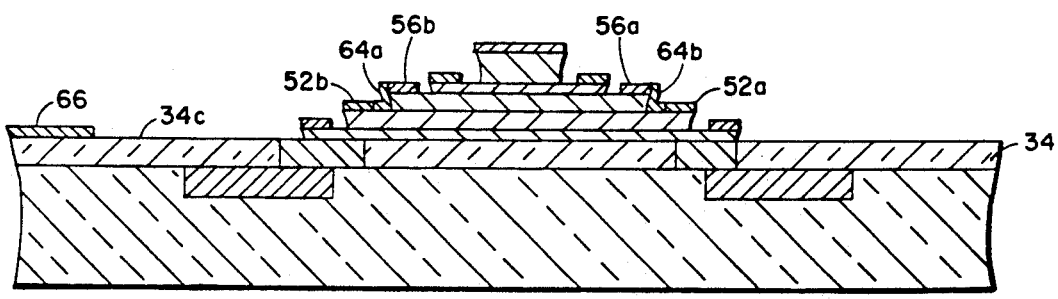

Referring now to FIG. 13, emitter electrodes 52a, 56a and 52b, 56b, are coupled together via thick metal layers 64a, 64b. This connection is optional since the emitter electrodes will be coupled together via air bridges which will be described in conjunction with FIG. 14. Transmission line 66, which may be used to connect to a DC bias pad (not shown), for example, is disposed over region 34c using well known patterning or lift off techniques as previously described in conjunction with FIG. 6.

Figure 14:
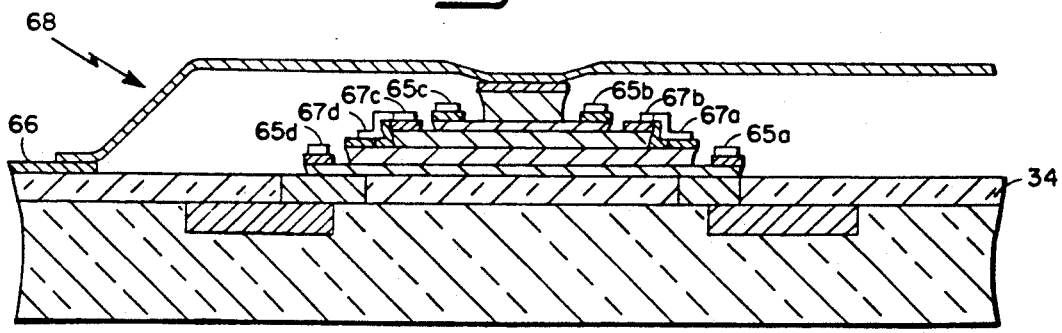
Figure 18:
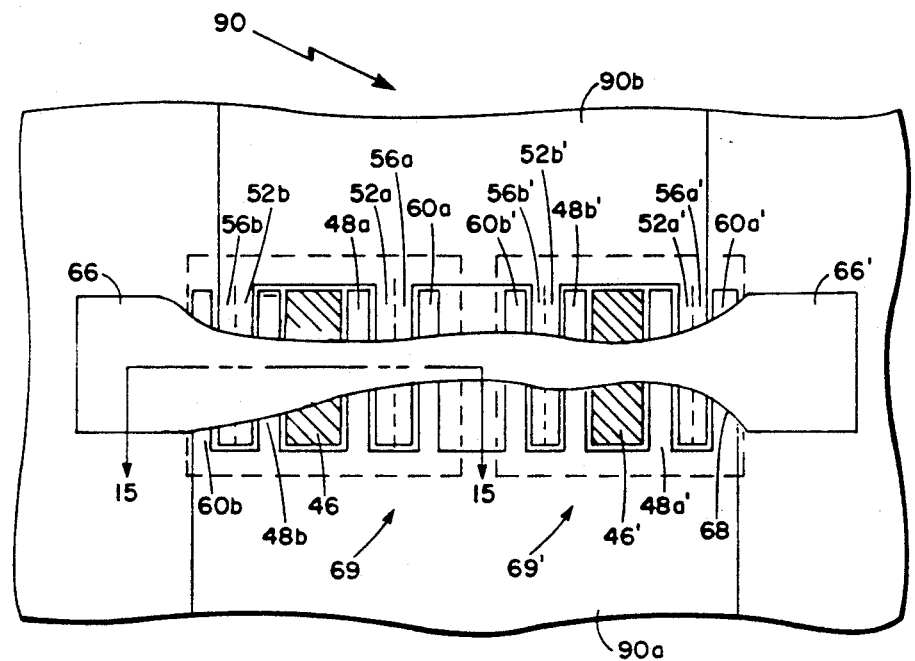
FIG. 18 is a plan view of a multi-cell push-pull hetero-junction bipolar transistor circuit fabricated as a monolithic microwave integrated circuit.

Referring now to FIG. 14, thick metal layers are deposited using well known techniques to provide a plurality of air bridges. Air bridge 68 is used to provide contact between transmission line 66 and first collector contact 46. In a multi-cell design, as shown in FIG. 18, air bridge 68 would make contact with all subsequent collector contacts. Other air bridges (not shown) having fingers 65a, 65b, 65c, 65d, 67a, 67b, 67c, 67d are provided to make contact to appropriate base and emitter electrodes respectively. Air bridges generally denoted 65 (FIG. 17) and 67 (FIG. 17), which include the above mentioned fingers, will be discussed in conjunction with FIG. 17. Suffice it here to say that air bridge 65 (FIG. 17) provides contact between base electrodes 48a, 48b, 60a, 60b (FIG. 11) and RF input transmission line 80a (FIG. 19). Similarly, air bridge 67 (FIG. 17) provides contact between emitter electrodes 52a, 52b, 56a, 56b (FIG. 11) and RF output transmission line 80b (FIG. 17).

Referring now to FIG. 15, backside processing of substrate 30 is provided to form plated vias 72a, 72b to interconnect sub-collectors 32a, 32b of HBT 69 to ground plane 70 as shown. Here, conventional techniques are used to provide the plated vias such as those described in U.S. Pat. No. 4,807,022 by Kazior et al. and assigned to the assignee of the present invention or U.S. Pat. No. 4,794,093 by Tong et al. and assigned to the assignee of the present invention. In particular, the above mentioned patents provide techniques for forming via holes and plated tub structures and would be particularly desirable for those circuits which incorporate high power dissipation elements, such as high power HBTs, to provide low thermal resistance paths between the transistors and the ground plane conductor 70. Here, tub shaped via holes are shown. Alternatively, slot shaped via holes 72' (FIG. 17) could provide grounding without increasing parasitic base collector capacitance.

The preferred embodiment of push-pull common collector transistor 69 described above has several advantages. First, the active region of the upper transistor is defined by the size of collector region 44a in a so-called "collector down" geometry. The "collector down" geometry minimizes parasitic base collector capacitance in the upper transistor which is desirable to achieve high gain.

Second, placement of collector regions 34a, 34b at the outside edges of base region 36a reduces the base-collector capacitance and takes advantage of the current crowding due to the base resistance in the transistor formed by layers 34a, 36a and 38a. This maximizes current gain at high current density.

Third, placement of collector regions 34a, 34b at the outside edges of base 36a provides an optimum heat flow path for the transistor.

Fourth, the overall mesa height of HBT 69 is low enough to be compatible with air bridge technology. This means it will be relatively easy to provide air bridge interconnects (not numbered) to the base, collector and emitter fingers (not numbered) to provide collective base, collector and emitter electrodes (not numbered) of the transistor 69.

Figure 16:
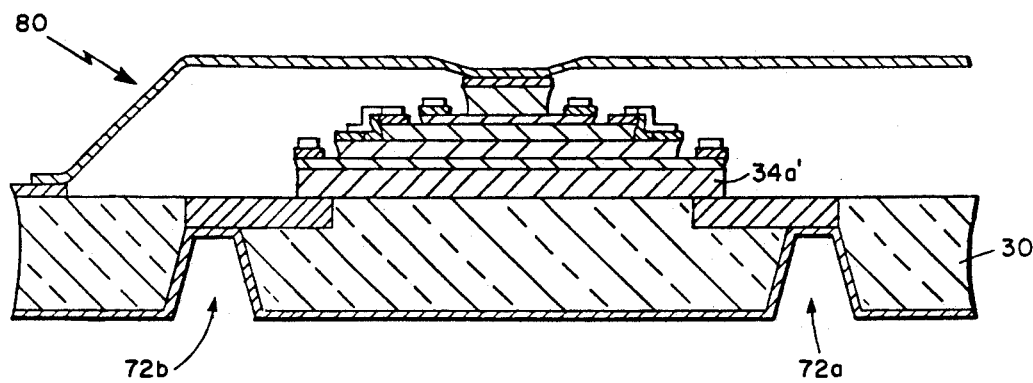
FIG. 16 is a cross-sectional view of an alternate embodiment of a single cell push-pull hetero-junction bipolar transistor circuit in accordance with a further aspect of the present invention.

Referring now to FIG. 16, an alternate embodiment of single cell push-pull HBT transistor circuit 69 (FIG. 15) is shown HBT transistor circuit 80 having a collector 34a, which is isolated using an etching technique. In this embodiment, second collector layer 34 (as described in FIG. 15) having a thickness in the range of 1.0 μm to 1.5 μm is disposed over semi-insulating substrate 30 but is not implant isolated. Rather, the layer 34 (FIG. 15) is isolated by etching away undesired portions, thereby to provide the collector region 34a'. The remaining structure of HBT 80 is substantially the same as the mesa structure provided in conjunction with single cell push-pull HBT transistor circuit 69 (FIG. 15) and thus the mesa structure provides push-pull common collector transistor 80.

The embodiment of transistor 80 has the advantage of eliminating the need to implant isolate layer 34 (FIG. 15). However, this embodiment has several drawbacks. First, the overall height of the device is increased which makes it more difficult to provide air bridge interconnects to collector, base, and emitter electrodes (not numbered). Moreover, the collector region 34a' of the transistor 80 is increased in size and thus there is a large increase in the base-collector capacitance.

Referring now to FIG. 17, a single cell push-pull HBT transistor circuit 80 (FIG. 16) is provided to show more clearly air bridges generally denoted 65, 67 and 68. These air bridges are substantially the same as air bridges 65 (FIG. 15), 67 (FIG. 15) and 68 (FIG. 15) of transistor 69 (FIG. 15).

Air bridge 65 comprised of fingers 65a, 65b provides contact between base electrodes 48a, 60a and RF input transmission line 80a. Here to more clearly illustrate air bridge 65, only that portion of air bridge 65 comprised of fingers 65a, 65b is shown. Fingers (not shown) similar to 65a, 65b would provide contact to base electrodes 48b, 60b, and further comprise air bridge 65.

Similarly, air bridge 67 comprised of fingers 67a, 67b provide contact between emitter electrodes 52a, 56a and RF output transmission line 80b. Here to more clearly illustrate air bridge 67 only that portion of air bridge 67 comprised of fingers 67a, 67b is shown. Fingers (not shown) similar to 67a, 67b would provide contact to emitter electrodes 52a, 52b on the other portion of the push-pull HBT mesa structure.

Transistor 80 further includes slot shaped via hole 72' to provide grounding to collector layer 48a through the subcollector (not shown). A slot shaped via hole provides an electrical path to ground while providing less parasitic base-collector capacitance than via hole structures having conventional shapes.

Referring now to FIG. 18, a multi-cell common collector push-pull transistor 90 as described in conjunction with FIGS. 2, 15, and 16, having bias terminals 66, 66' RF input terminal 90a and RF output terminal 90b, is shown to include a pair of push-pull transistor circuits 69, 69, Air bridge 68, shown here having portions thereof removed to more clearly show the underlying transistor structure, provides interconnects between collector contacts 46, 46, and bias pads 66, 66, Air bridges (not numbered) also provide interconnects between base electrodes 48a, 48b, 60a, 60b, 48a', 48b', 60a', 60b', and input terminal 90a and emitter electrodes 52a, 52b, 56a, 56b, 52a', 52b', 56a', 56b' and output terminal 90b.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A heterojunction bipolar transistor comprising:
   a substrate having first and second opposing surfaces with a ground plane conductor disposed over a first surface thereof, and having at least one doped region of a first type dopant on a second surface thereof;
   a first layer comprised of a first Group III-V material doped with the first type dopant disposed over the second surface of said substrate;
   a second layer comprised of the first Group III-V material having a dopant concentration of a second dopant type and disposed over at least a portion of said first layer;
   first means for providing ohmic contact to said second layer;
   a third layer comprised of a second Group III-V material having a band gap energy which is wider than that of the first Group III-V material and doped with the first dopant type, disposed over at least a portion of said second layer;
   a fourth layer comprised of the second Group III-V material and doped with the second type dopant disposed over at least a portion of said third layer;
   second means for providing ohmic contact to said third layer and said fourth layer;
   a fifth layer comprised of said first Group III-V material and doped with the second dopant type disposed over at least a portion of said fourth layer;
   third means for providing ohmic contact to said fifth layer;
   a sixth layer comprised of said first Group III-V material and doped with the first dopant type disposed over said fifth layer; an
   fourth means for providing ohmic contact to said sixth layer.

2. The transistor of claim 1 wherein said first Group III-V material is GaAs and said second Group III-V material is AlGaAs.

3. The transistor of claim 2 further comprising means for electrically coupling said doped region on said second surface of said substrate to said ground plane conductor.

4. The transistor of claim 1 further comprising means for rendering selected portions of said first layer semi-insulating.

5. The transistor of claim 4 wherein said rendering means includes an impurity species disposed in said selected portions of the material of said first layer in a region thereof underlying a portion of said second layer to render said selected portions of said material of said first layer semi-insulating.

6. The transistor of claim 1 where the one doped region of a first type dopant disposed over the second surface of said substrate is a first doped region and said second surface further includes a second doped region and wherein said first layer is disposed between the first doped region of said second surface of said substrate and the second doped region of said second surface of said substrate 7. The transistor of claim 1 further comprising at least one etch stop layer with said etch stop layer being disposed between two adjacent layers of said transistor.

8. The transistor of claim 7 wherein a first etch stop layer is disposed between said sixth layer and said fifth layer;
   a second etch stop layer is disposed between said fourth and third layers.

9. The transistor of claim 8 wherein a third etch stop layer is disposed between said third and second layers;
   a fourth etch stop layer is disposed between said second and first layers.

10. The transistor of claim 9 wherein a fifth etch stop layer is disposed between said fifth and said fourth layers.

11. The transistor of claim 10 wherein said etch stop layer is comprised of InGaAs.

12. The transistor of claim 3 wherein said means for electrically coupling comprises a via hole in said substrate having a slot shape and an electrically conductive material disposed over sidewall surfaces of said substrate exposed in the via hole.

13. A heterojunction bipolar transistor comprising:

a substrate having first and second opposing surfaces with a ground plane conductor disposed over a first surface thereof and having a pair of spaced doped regions of a first type dopant in a second surface thereof;

a first layer comprised of a first Group II-V material doped with the first type dopanat disposed over the second surface of said substrate between and in contact with said pair of doped regions;

a second layer comprised of the first Group III-V material having a dopant concentration of a second dopant type and disposed over at least a portion of said first layer;

first means for providing ohmic contact to said second layer;

a third layer comprised of a second Group III-V material and doped with the first dopant type, disposed over a portion of said second layer;

a fourth layer comprised of the second Group III-V material and doped with the second type dopant disposed over at least a portion of said third layer;

second means for providing ohmic contact to said third layer and said fourth layer;

a fifth layer comprised of said first Group III-V material and doped with the second dopant type disposed over at least a portion of said fourth layer;

third means for providing ohmic contact to said fifth layer;

a sixth layer comprised of said first Group III-V material and doped with the first dopant type disposed over said fifth layer; and fourth means for providing ohmic contact to said sixth layer.

14. The transistor of claim 13 wherein said first Group III-V material is GaAS and said second Group III-V material is AlGaAs.

15. The transistor of claim 14 further comprising at least one etch stop layer comprised of a third Group III-V material disposed between two adjacent layers of said transistor.

16. The transistor of claim 15 wherein said third Group III-V material is InGaAs.

* * * * *